(12) United States Patent
McGowan et al.

(10) Patent No.: US 9,829,159 B2
(45) Date of Patent: Nov. 28, 2017

(54) LED MODULE

(71) Applicants: MOLEX INCORPORATED, Lisle, IL (US); Daniel B. McGowan, Lisle, IL (US); Michael C. Picini, Lisle, IL (US)

(72) Inventors: Daniel B. McGowan, Glen Ellyn, IL (US); Michael C. Picini, Aurora, IL (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 14/913,627

(22) PCT Filed: Aug. 22, 2014

(86) PCT No.: PCT/US2014/052336
§ 371 (c)(1),
(2) Date: Feb. 22, 2016

(87) PCT Pub. No.: WO2015/027180
PCT Pub. Date: Feb. 26, 2015

(65) Prior Publication Data
US 2016/0208987 A1    Jul. 21, 2016

Related U.S. Application Data

(60) Provisional application No. 61/869,367, filed on Aug. 23, 2013.

(51) Int. Cl.
*F21K 99/00* (2016.01)
*H05K 1/18* (2006.01)
(Continued)

(52) U.S. Cl.
CPC ............... *F21K 9/30* (2013.01); *F21K 9/20* (2016.08); *H01L 25/0753* (2013.01);
(Continued)

(58) Field of Classification Search
CPC ......... F21K 9/30; F21K 9/20; H01L 25/0753; H01L 33/54; H01L 33/56; H01L 33/60;
(Continued)

(56) References Cited

U.S. PATENT DOCUMENTS 7,690,813 B2    4/2010  Kanamori et al.
7,887,384 B2    2/2011  Shaikevitch et al.
(Continued)

FOREIGN PATENT DOCUMENTS

DE    10 2007 046639 A1    4/2009
JP          11-317471 A          11/1999
(Continued)

*Primary Examiner* — Mary Ellen Bowman
(74) *Attorney, Agent, or Firm* — Jeffrey K. Jacobs

(57) ABSTRACT

A light emitting diode (LED) module includes a base that is conductive and is selectively covered with an insulative layer. The base can include a connecting flange and a light emitting region. Traces are provided on the insulative coating and can be used to connect LEDs positioned on the light emitting region to pads on the connecting flange. The connecting flange can be offset in angle and/or position from the base and can be configured to provide a contact shape suitable to mate with a connector in a polarized manner. The base can be shaped so as to provide the desired functionality.

13 Claims, 8 Drawing Sheets

(51) Int. Cl.
    *H05K 1/05*         (2006.01)
    *H01L 25/075*     (2006.01)
    *H01L 33/54*      (2010.01)
    *H01L 33/56*      (2010.01)
    *H01L 33/60*      (2010.01)
    *H01L 33/62*      (2010.01)
    *H01L 33/64*      (2010.01)
    *H05K 3/00*       (2006.01)
    *H05K 3/12*       (2006.01)
    *F21K 9/20*       (2016.01)
    *H05K 1/11*       (2006.01)
    *F21Y 115/10*     (2016.01)

(52) U.S. Cl.
    CPC .............. *H01L 33/54* (2013.01); *H01L 33/56* (2013.01); *H01L 33/60* (2013.01); *H01L 33/62* (2013.01); *H01L 33/647* (2013.01); *H05K 1/05* (2013.01); *H05K 1/183* (2013.01); *H05K 3/0026* (2013.01); *H05K 3/12* (2013.01); *F21Y 2115/10* (2016.08); *H01L 2224/48091* (2013.01); *H01L 2224/48137* (2013.01); *H01L 2224/73265* (2013.01); *H01L 2933/005* (2013.01); *H01L 2933/0066* (2013.01); *H05K 1/117* (2013.01); *H05K 2201/09018* (2013.01); *H05K 2201/09081* (2013.01); *H05K 2201/10106* (2013.01); *H05K 2201/2054* (2013.01)

(58) Field of Classification Search
    CPC ......... H01L 33/62; H01L 33/647; H05K 1/05; H05K 1/183; H05K 3/0026; H05K 3/12
See application file for complete search history.

(56) References Cited

U.S. PATENT DOCUMENTS

| | | | |
|---|---|---|---|
| 8,071,997 | B2 | 12/2011 | Scotch et al. |
| 8,587,011 | B2 | 11/2013 | Matsuda et al. |
| 9,538,665 | B2 | 1/2017 | Bastenbeck et al. |
| 2005/0073846 | A1 | 4/2005 | Takine |
| 2006/0043382 | A1 | 3/2006 | Matsui et al. |
| 2010/0240158 | A1 | 9/2010 | Ter-Hovhannissian |
| 2010/0298965 | A1 | 11/2010 | Liu et al. |
| 2010/0327310 | A1* | 12/2010 | Lin ................. H01L 21/486 257/99 |
| 2012/0182753 | A1 | 7/2012 | Otsubo et al. |
| 2013/0161670 | A1* | 6/2013 | Peng .................. H01L 33/647 257/98 |
| 2013/0176732 | A1 | 7/2013 | McGowan et al. |

FOREIGN PATENT DOCUMENTS

| | | |
|---|---|---|
| JP | 2009-032650 A | 2/2009 |
| JP | 2009-301795 A | 12/2009 |
| JP | 2011-060961 A | 3/2011 |
| JP | 2011-134677 A | 7/2011 |
| JP | 2011-216868 A | 10/2011 |
| JP | 2011-238802 A | 11/2011 |
| JP | 2012-009886 A | 1/2012 |
| JP | 2012-084327 A | 4/2012 |
| JP | 2012-124498 A | 6/2012 |
| JP | 2012-222228 A | 11/2012 |
| JP | 2013-128013 A | 6/2013 |

* cited by examiner

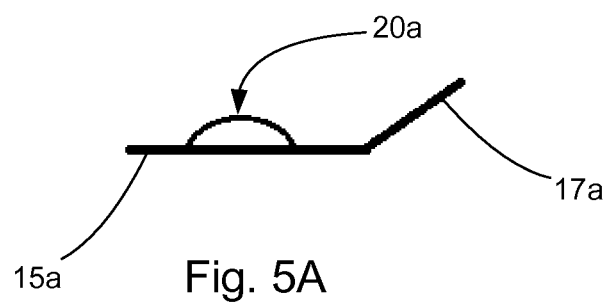
Fig. 5A
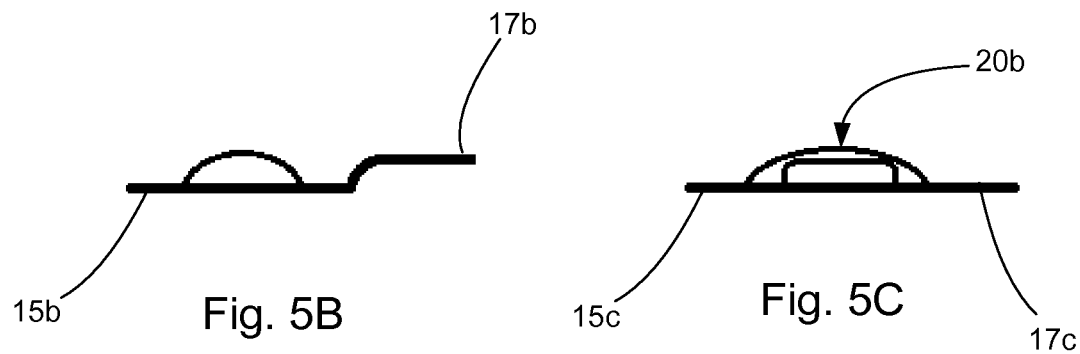
Fig. 5B
Fig. 5C
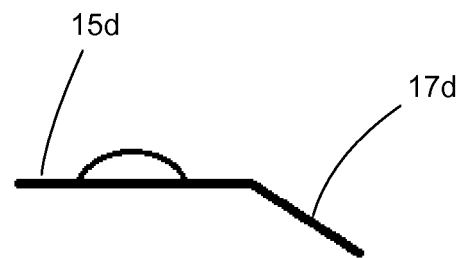
Fig. 5D

LED MODULE

RELATED APPLICATIONS

This application is a national phase of PCT Application No. PCT/US2014/052336, filed Aug. 22, 2014, which in turn claims priority to U.S. Provisional Application No. 61/869,367, filed Aug. 23, 2013, both of which are incorporated herein by reference in their entirety.

TECHNICAL FIELD

This disclosure relates to the field of solid state lighting with a light emitting diode (LED), more specifically to the field of LED modules.

DESCRIPTION OF RELATED ART

LED modules are a known way of providing illuminate with the use of LEDs. LEDs require preparation to be useful in lighting. Existing LEI) modules include a LED array that is configured based on the type of LED. For example, chip-on-board (COB) LEDs array include LED chips that are typically mounted on a reflective surface and electrically connected together with wire-bonding. Because it is somewhat more complicated to have and maintain a balance of red, green and blue colors so as to provide desired light output, often it is desirable to have an efficient LED that emits a small range of wavelengths and use a phosphor to convert the emitted wavelengths to a desirable spectrum. Thus, an LED array can include one or more LED chips placed on a substrate, the substrate which can be a metal clad PCB or other desirable material. The LED chips are wire bonded in a pattern that connects them to an anode and cathode and then the chips can be covered appropriate layers of silicone and phosphor so as to protect the chips while providing a conversion of the light with the phosphor layer.

The resultant LED array provides top facing LEDs and also can provide top facing contacts that are electrically connected to the anode and cathode. This makes it possible to secure the LED array to a heat sink and connect power to the contacts in a reliable manner (e.g., by pressing down on the LED array with a holder). Because of the increasing efficiency of LEDs, the LED array has become smaller and that has resulted in the ability to offer a substrate that is reduced in size. While this would be beneficial from a cost standpoint, the reduction in size has made it more difficult to work with and secure the LED array into an application (such as a fixture or bulb). One way to address the handling problem is to use a holder to secure the LED array. A holder, which can be firmed of an insulative material, can provide electrical connection to the contacts on the LED substrate and he mounted securely to the LED array. For example, the physical connection can be made with the use of solder or conductive adhesive without the use of secondary fasteners, thus the size of the LED array can he minimized and the holder (being formed of less costly materials) can provide the physical and electrical connection between the contacts and an external power source. An embodiment of a possible construction of an LED module so constructed is depicted in U.S. Publication No. 2013/0176732, filed Jan 4, 2013. While such LED modules are suitable for a number of applications, further improvements would be appreciated by certain individuals.

BRIEF SUMMARY

A light emitting diode (LED) Nodule includes a base that is thermally and electrically conductive and the base includes a light engine designed to emit light and a connecting flange. An insulative layer is selectively applied to the base and the insulative layer can be a powder coat. Traces are formed on the insulative layer in a pattern. LEDs are placed on a reflective area, which is preferably not covered with the insulative layer. The traces, which are conductive, are electrically connected to the LEDs. A protective covering is placed over the LEDS once they are electrically connected to the traces. The traces extend from adjacent the LEDs to the connecting flange. In operation the connecting flange may receive a connector that allows power to be provided to the LEDs.

BRIEF DESCRIPTION OF THE DRAWINGS

The present invention is illustrated by way of example and not limited in the accompanying figures in which like reference numerals indicate similar elements and in which:

FIG. 5A illustrates an elevated side view of a schematic representation of an embodiment of a base and light engine.

FIG. 5B illustrates an elevated side view of a schematic representation of another embodiment of a base and light engine.

FIG. 5C illustrates an elevated side view of a schematic representation of another embodiment of a base and light engine.

FIG. 5D illustrates an elevated side view of a schematic representation of another embodiment of a base and light engine.

DETAILED DESCRIPTION

The detailed description that follows describes exemplary embodiments and is not intended to be limited to the expressly disclosed combination(s). Therefore, unless otherwise noted, features disclosed herein may be combined together to firm additional combinations that were not otherwise shown for purposes of brevity.

Figure 1:
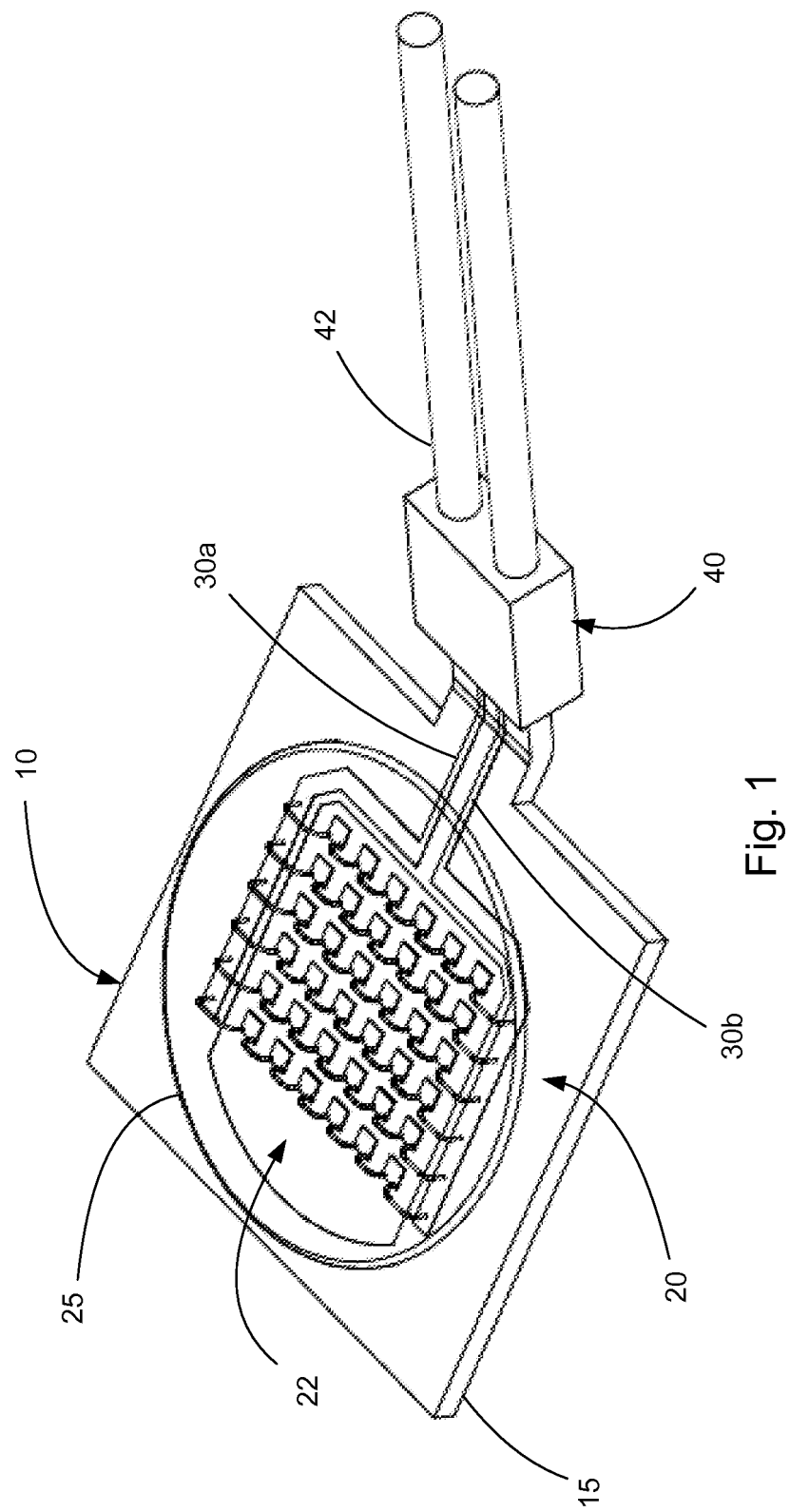
FIG. 1 illustrates a perspective view of an embodiment of LED module.
Figure 2:
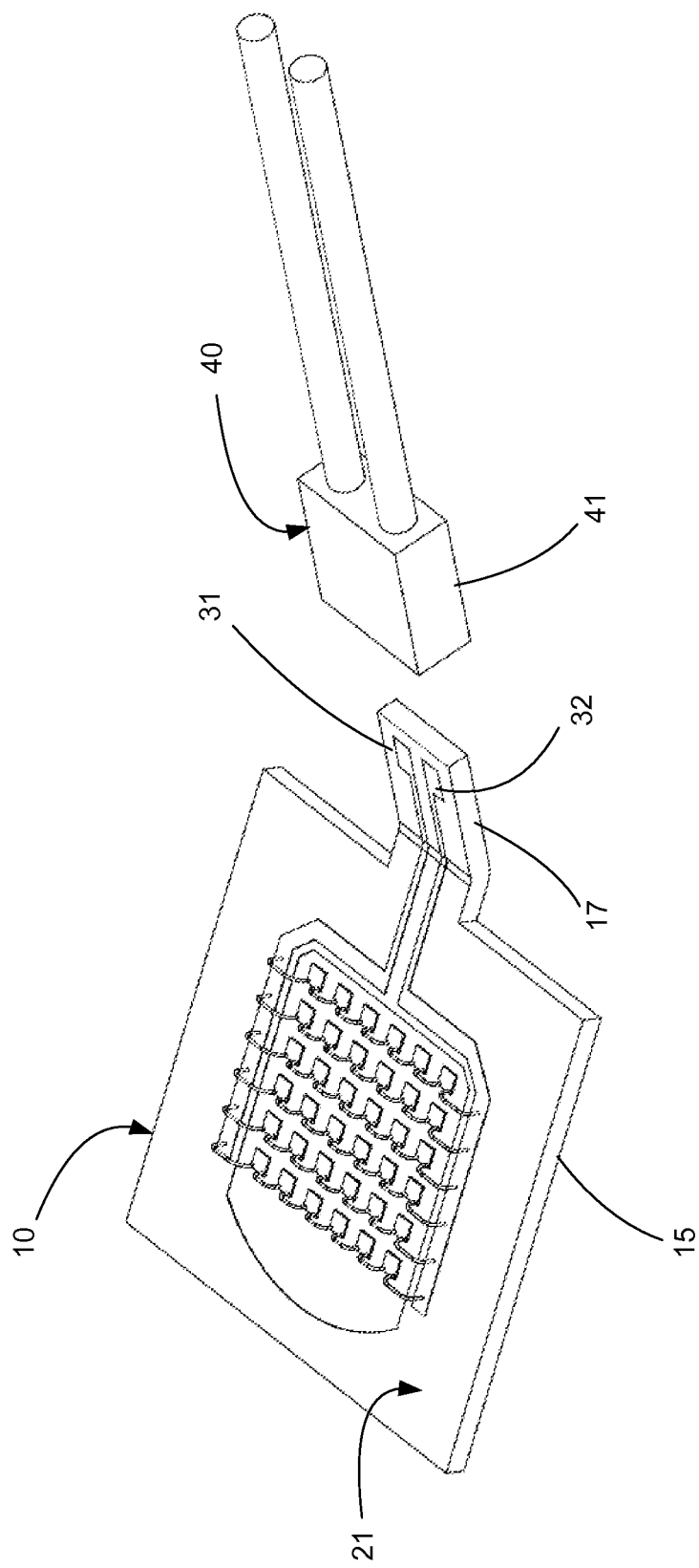
FIG. 2 illustrates a simplified, partially exploded perspective view of t embodiment depicted in FIG. 1.
Figure 3:
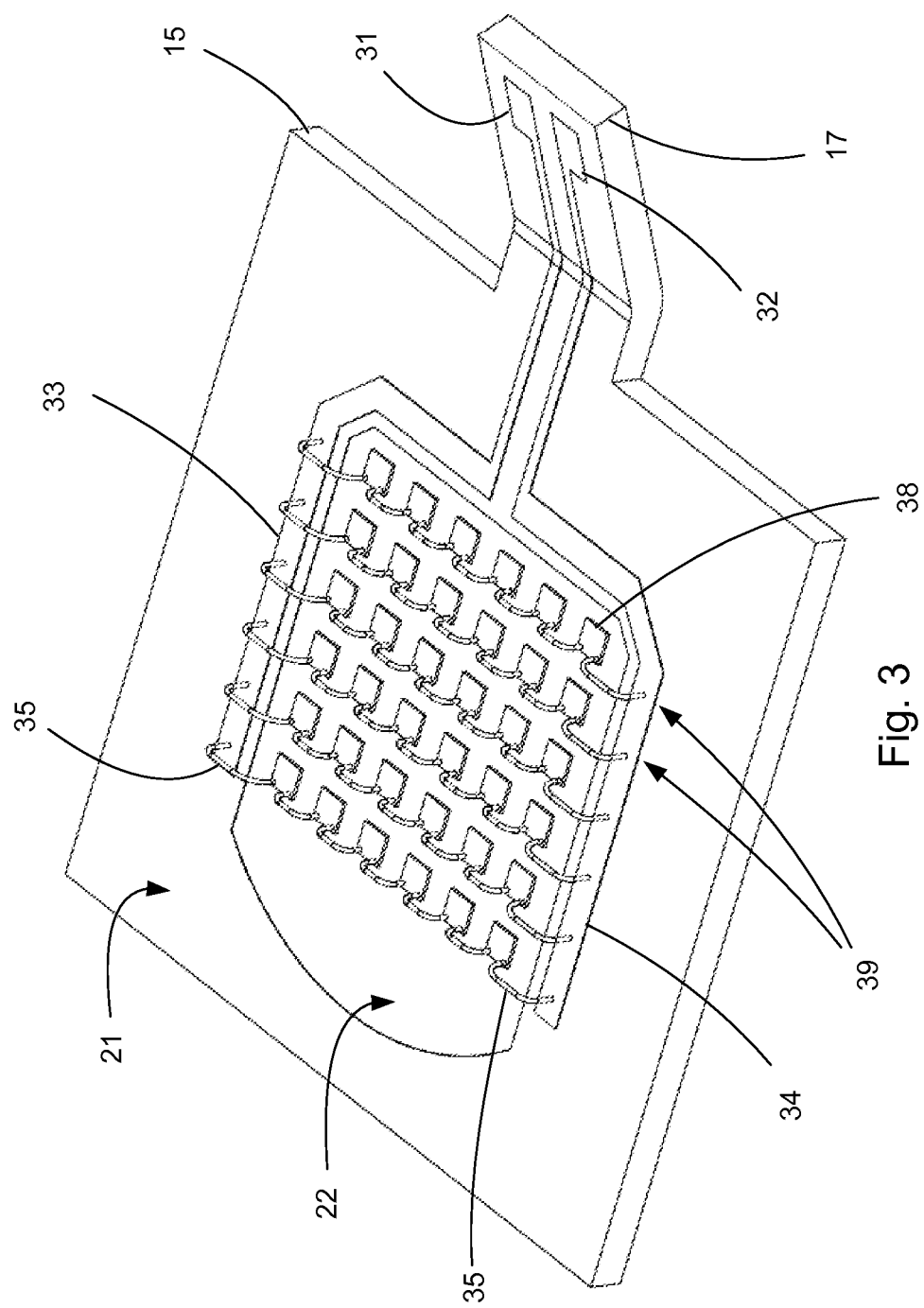
FIG. 3 illustrates an enlarged perspective view of the LED module depicted in FIG. 2.

FIGS. 1-3 illustrate a first embodiment of a light emitting diode (LED) module 10. The LED module 10 includes a base 15 that is conductive and includes an insulative layer 21 provided on the base 15 in a selective manner. The base 15 supports a light emitting region 20, which includes LED chips 38 that are positioned in a reflective area 22. The reflective area 22 is preferably free of the insulative layer 21. To provide power to the LED chips 38, conductive traces 30a, 30b are provided on the insulative layer 21. The trace 30a extends from pad 31 (which acts as an anode) to connecting region 33 and the trace 30b extends from pad 32 (which acts as a cathode) to connecting region 34. Wire bonds 35 are used to electrically connect the various LED chips 38 to the connecting regions 33, 34 in a desired pattern. As can be appreciated, the pads 31, 32 are positioned on a connecting flange 17. The connecting flange 17 can extend from the base 15 at an angle so as to provide access for a connector 40, assuming the base 15 is mounted flush with a supporting surface (not shown). As can be appreciated from FIGS. 5A-5D, the connecting flange 17a-17d can be provided in a wide range of configurations, such as angled up, angled down, parallel with or parallel and offset with the base 15a-15d. in other words, the light emitting region 20a, 20b can be orientated at a different angle than the connecting flange. Other configurations could also be provided if desired.

The light emitting region 20 includes a protective layer 25 that can be formed of a material such as silicone and the light emitting region 20 may include a layer of a phosphor slurry that acts to convert emitted illumination into a more desirable wavelength of light. More will be said about possible variations in the protective layer 25 below.

The traces 30a, 30b, which are used to power the light emitting region 20, can be applied by selectively placing the insulating layer 21 on the desired surfaces of the base 15 via a powder coating technique. Once the insulative layer 21 is provided on the desired surfaces of the base 15 (such as a top surfaces, one or more side surfaces and a bottom surface), the base 15 can be cured so that the resulting insulative layer 21 provides desirable electrical isolation. It should be noted that the insulative layer 21 can cover substantial portions of the base 15 (including the side surfaces and the bottom surfaces of the base 15). Providing additional coverage can help electrically isolate the traces 30a, 30b from the base and can also help electrically isolate the base 15 itself from any exposed metal that might be contained on an adjacent component (such as a heatsink or supporting fixture).

Figure 7:
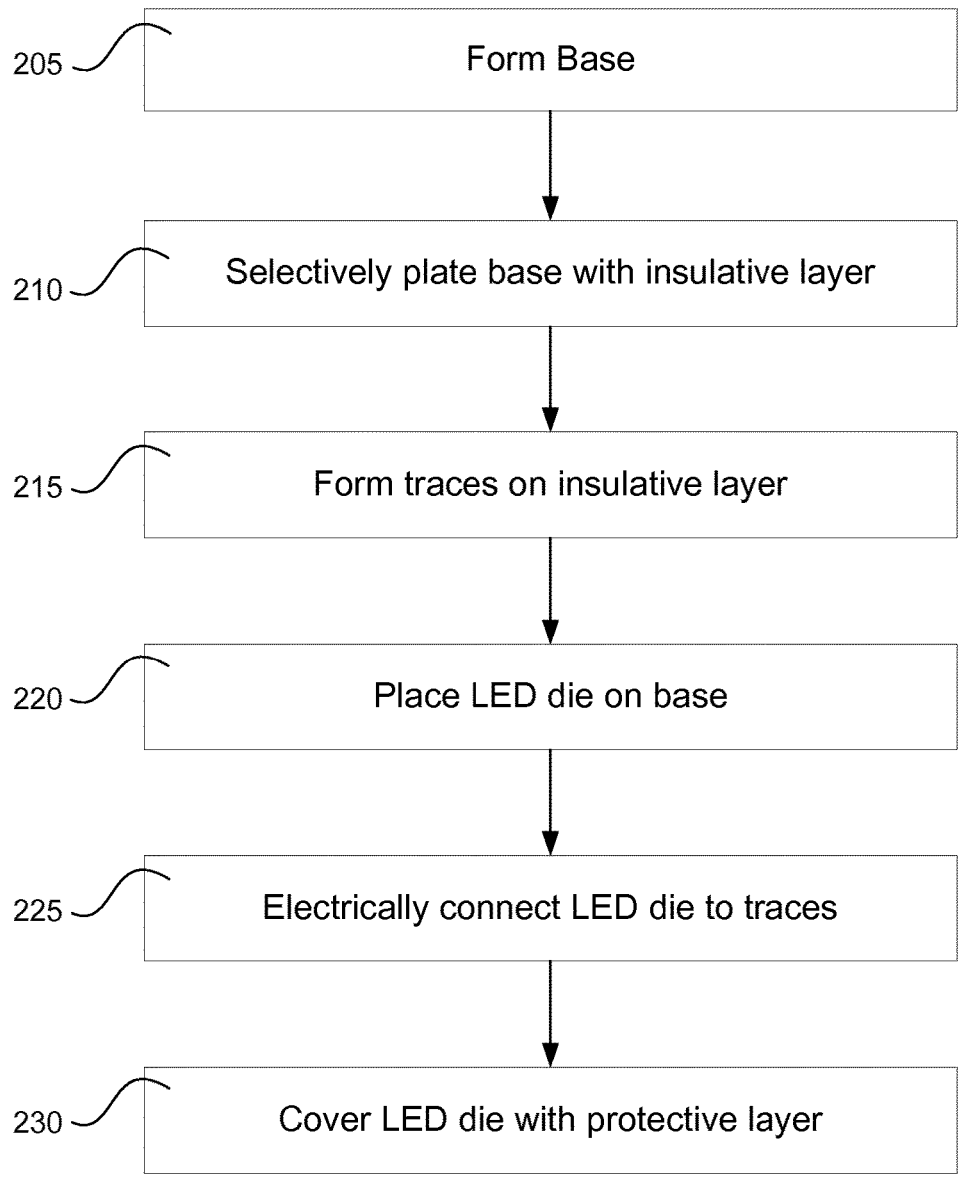
FIG. 7 illustrates a method of providing an LED module.

Once the base 15 has the insulative layer 21 selectively applied, traces 30a. 30b can be formed on the insulative layer 21. FIG. 7, discussed below, provides additional information in how an LED module can be formed, including a discussion of the process of forming traces, which is discussed in greater detail. As can be appreciated, the insulative layer 21 is applied on the connecting flange 17 so that traces can be formed.

As noted above, the reflective area 22 can omit the insulative layer 21 and in an embodiment the reflective area 22 can be polished to aid in light extraction. LED chips 38 are placed on the reflective area 22 in a desired. As depicted in FIG. 3, for example, a plurality of LEDs are connected in series to form a LED path 39 and two or more LED paths can be provided in parallel. Naturally, other circuit patterns can be provided as desired. It has been determined that it is desirable to have the LED path 39 configured so that it is actuated by a potential of less than 50 volts and more desirable to have the potential needed to actuate the LED path 39 be less than 25 volts. The use of a lower voltage makes it easier to provide a suitable power supply and also improves creepage and clearance issues.

Figure 4:
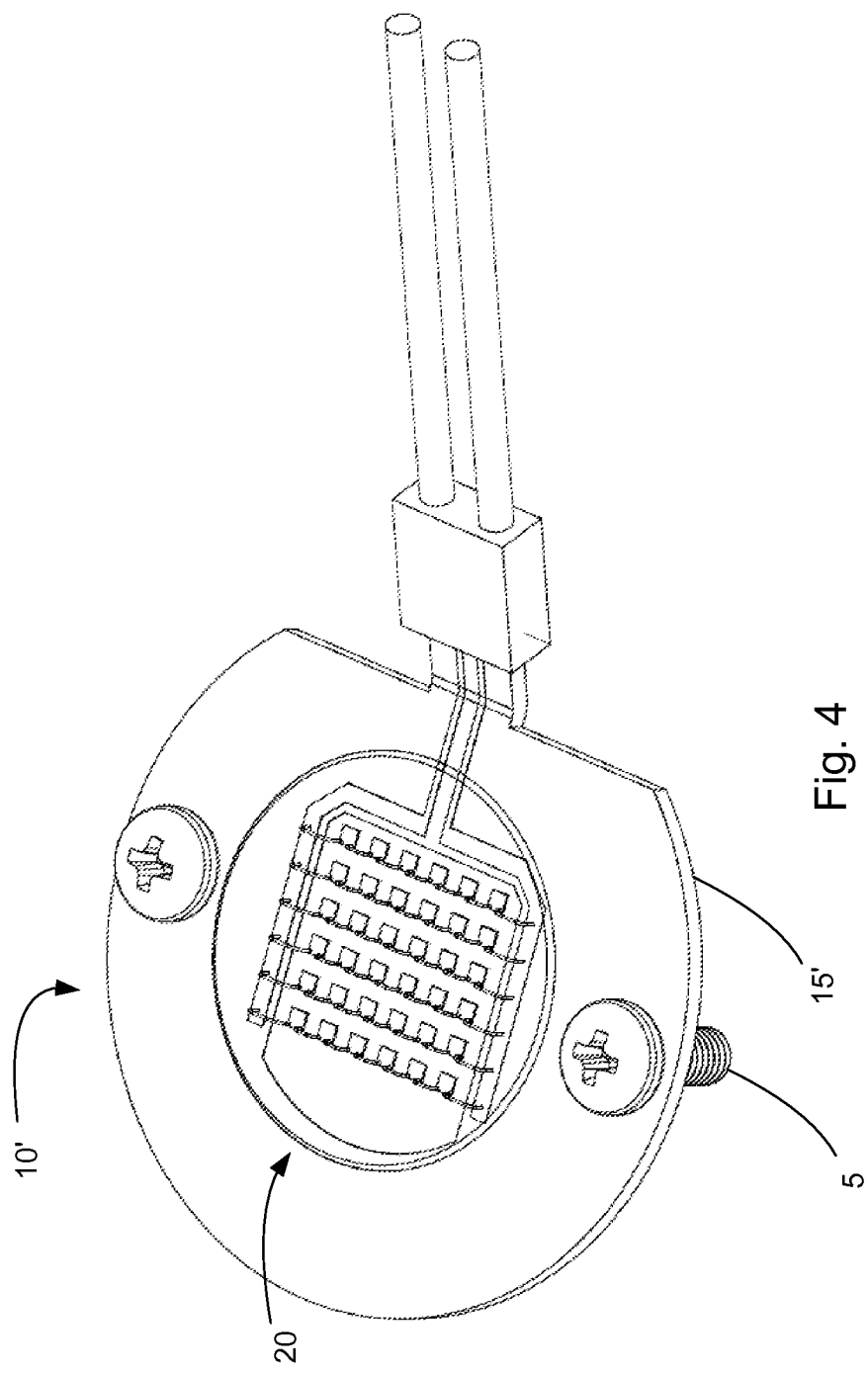
FIG. 4 illustrates a perspective view of another embodiment of an LED module.

As can be appreciated from FIG. 4, another embodiment of a LED module 10' is depicted with a light emitting region 20 that includes a base 15' with fastener apertures so that conventional fasteners (such as but not limited to screw 5) can be used to secure the LED module 10' in position. In other embodiments, the base can be sized and shaped so that a fixture holds the LED module in position without the use of separate fasteners. For example, a fixture can be designed with a snap in feature that allows the module to engage a power source and held in position with a clip. In such a situation, the LED module can include a thermal-coupling layer (such as a thermal pad or thermal grease) on a bottom surface of the base that helps provide improved thermal transfer between the LED module and a supporting surface.

The conductive traces 30a, 30b extend from adjacent the reflective area 21 to the connecting flange 17. The connecting flange 17 can be sized and configured to mate with a connector 40, where the connector has a body 41 that supports terminals that are electrically connect to wires 42. The terminals are configured to mate with the anode, cathode 31, 32 and thus provide an electrical connection to the light emitting region 20. The connecting flange 17 can be configured so that it engages a connector in a polarized manner. It should be noted that in most of the depicted embodiments the connecting flange 17 is orientated differently than the base 15. The advantage of having the connecting flange orientated/configured in a manner that is different than the base is that it allows for ease of connecting the connector 40 to the pads on the connecting flange. For example, the base can have a low profile so as to minimize interference with light output while the connecting flange can be angled in a manner that makes mating to a connector simple and flexible. It should be noted that while the embodiments in FIGS. 1-4 illustrate a connecting flange that is angled in a direction toward the illumination output angle (e.g., similar to that depicted in FIG. 5A), in an alternative embodiment the connecting flange could be angled in the opposite direction (e.g., similar to that depicted in FIG. 5D), In addition, the connecting flange could be offset from the base (as depicted in FIG. 5B, which show the connecting flange parallel but offset from the base).

Figure 6:
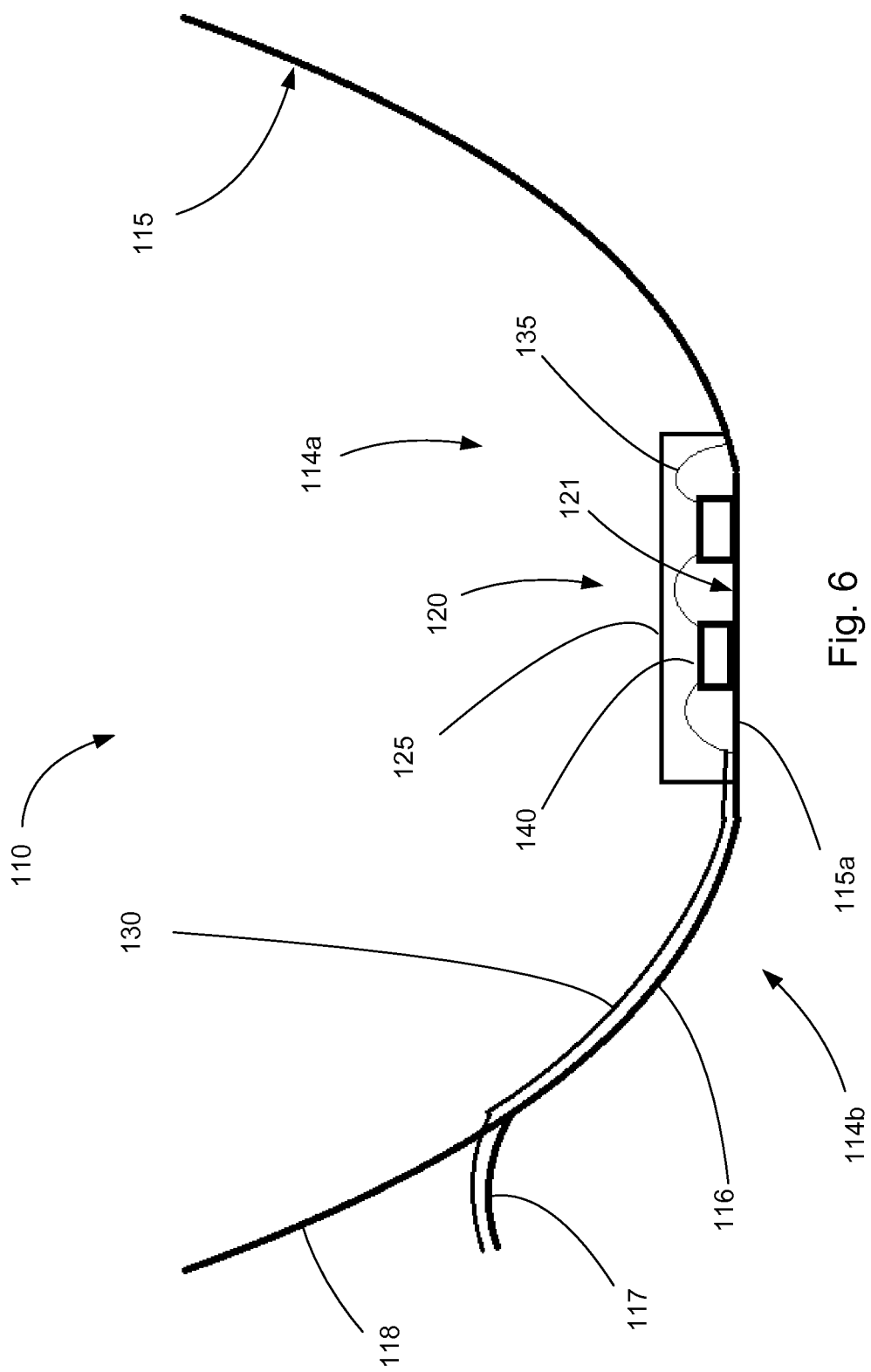
FIG. 6 illustrates a schematic depiction of another embodiment of an LED module.

It should be noted that in certain embodiments the connecting flange could also be aligned parallel with the base of the light emitting region of the LED module (as depicted in FIG. 5C). Such a configuration would be suitable, for example, in applications where the fixture includes contacts that can engage a flat surface and the module is intended to engage the contacts on one side away from the light emitting region (in an embodiment the contacts in the fixture could be recessed or shrouded so as to provide a touch safe environment), FIG. 6 illustrates another embodiment of an LED module 110 with additional features included. A base 115 includes a flat region 115a that provides a light emitting region 120, a first curved portion 116, and a connecting flange 117 and a second curved portion 118. As can be appreciated, the light emitting region 120 is positioned in the middle of a curved portion so as to provide a reflective structure that shapes the light in a focused manner. The base 110 further includes a reflection region 121 that primarily is intended to reflect light emitted from LEDs 140 either out of the LED module or toward the first and second curved portions 116, 118. As in the above embodiments, the curved portions can be covered with an insulative layer that allows for electrical isolation. In an embodiment the insulative layer can be both electrically isolated and also have a diffuse highly reflective property, where the reflective nature of the insulative layer exceeds 90 percent.

The LEDs 140, as in the previous embodiments, are connected electrically with wire bonds 135 in a desired pattern and can be covered with a protective layer 125 that can include a phosphor layer and/or silicone layers. The wire bonds 135 connect to conductive traces 130, which extending along an insulative layer provided on the first curved portion 116 and through an aperture in the base 110 to the connecting flange 117. Thus, the insulative layer extends from the light emitting region 120 to the connecting flange 117. Due to the configuration, the LED module 110 can emit light on first side 114*a* of the base and be connected to power on a second side 114*b* of the base 115 and this can be beneficial in allowing for more desirable fixture designs that place electronics and power deliver on one side of the base and the light emitting region on the other side of the base. As can be appreciated, with the use of a pattern of traces on both sides of the base 115 it is possible to have components (such as, without limitation, drivers, capacitors, thermistors and fuses) soldered to the traces provided on one side of the base while avoiding any interference with emitted light that is provided with LED chips positioned on another side of the base. Naturally, if the base is large enough, additional components and the LED chips could also all be fastened on the same side of the base.

It should be noted that because the base 115 is thermally conductive, the base 115 can be used as a heat sink and, depending on the application, may be sufficient to manage the thermal load by itself. In alternative embodiments, the base 115 can be used as a heat spreader and help direct thermal energy to a heat sink.

FIG. 7 illustrates a method that can be used to provide a LED module. First in step 205 a base is formed of a thermally conductive material (such as aluminum or any other desirable thermally conductive metal or metal alloy and in most cases the base will also be electrically conductive). As noted above, the base can have a variety of different shapes depending on the application. Next in step 210 the base is selectively plated with an insulative layer, which could be a powder coat. In step 215 traces are formed on the insulative layer. In an embodiment this can involve using a laser to activate the insulative layer in a pattern similar to how laser direct structuring is done on plastic. Once the pattern is formed, the base can be placed in a plating bath so that the pattern is plated through the use of an electroless process. If desired, the thickness of the traces can be further increased, either through additional electroless plating or through the use of electroplating by applying a charge to the traces and then placing the base in a plating bath. Alternatively, the traces can be formed on the insulative layer with an inkjet technique by printing conductive ink directly on the insulative layer. If the traces are formed with an inkjet technique then it may be desirable, depending on the application and the desired current, to further plate the traces so as to provide a thicker trace that can handle higher current loads and this preferably will be done using electroplating. It is expected, however, that with an appropriate conductive ink such additional plating will not be necessary. It should be noted that the traces can be formed on more than one side of the base if desired and can include gaps and complicated patterns that allow other electrical components (besides the LED die) to be connected to the traces. As can be appreciated, the traces will be isolated from any exposed portion of the base and thus the electroplating operation can be selectively applied.

Once the conductive traces are formed, LED die can be placed on the base in step 220. As can be appreciated, the process of applying die can be done to a region that is cleaned and polished prior to placement of the die (e.g., the die can be placed on a reflective area, as discussed above), in step 225 the LED die are wire bonded together and connected to the traces. Finally in step 230 the LEDs are covered with a protective layer that can include a silicone layer and an optional phosphor slurry layer. Additional layers and filters can be added if desired. For example, particular wavelengths of light can be blocked if those wavelengths are determined to be undesirable. Additional components can also be mounted to the base. As can be appreciated, additional components could be attached with solder or a conductive adhesive.

Figure 8:
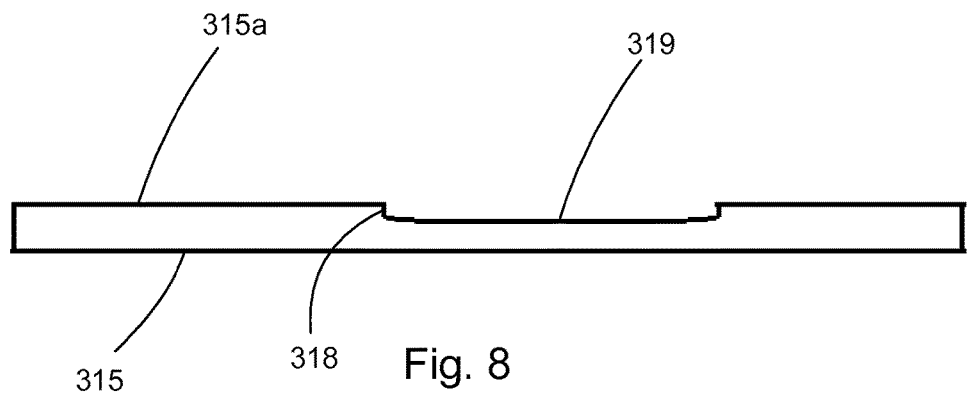
FIG. 8 illustrates a side view of a schematic representation of a simplified embodiment of a base suitable for use with an LED module.
Figure 9:
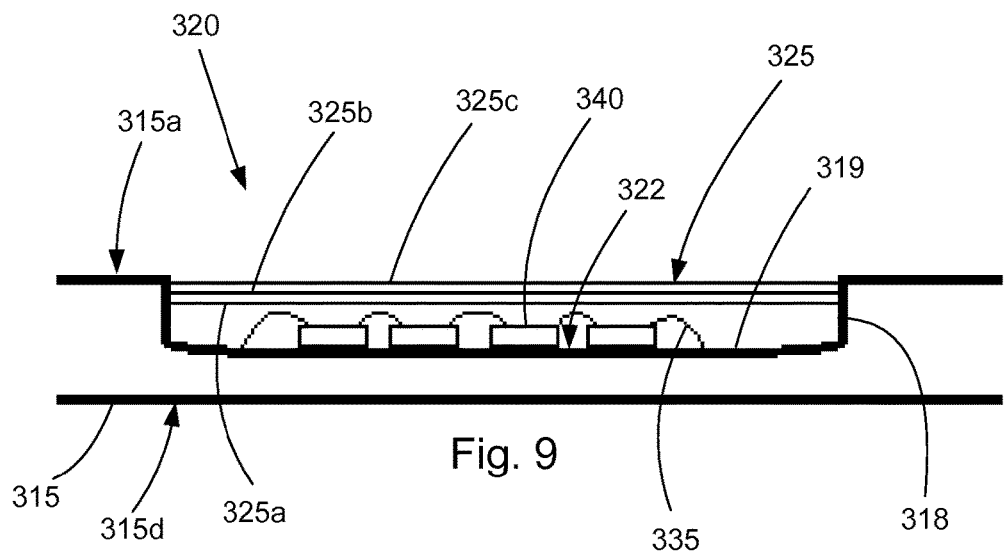
FIG. 9 illustrates a side view of a schematic representation of an embodiment of an LED module.

FIGS. 8-9 illustrate schematic representations of a cross section of an embodiment of a base 315 that can be used in a LED module and the base 315 includes a recessed region 319 with wall 318. The recessed region 319 includes a reflective area 322 and thus provides a light emitting region that is between a top surface 315*a* and a bottom surface 315*d*. The recessed region 319 can be as depicted with a portion of the base removed or flattened and thus results in a base where the bottom surface 315*d* is on a single plane. Alternatively the thickness of the base could be kept constant and the recession region area just pressed down (which would result in the bottom surface of the base not being on a single plane). Either way, the recessed region 319 provides a light emitting area. The recessed region 319 allows LED chips 340 to be positioned in the reflective area 322 and electrically connected with wire bonds 335. To protect the chips and the wire bonds, a first silicone layer 325*a* can be placed over the LED chips 340. Then a phosphor layer 325*b* can be provided over the first silicone layer. The phosphor layer 325*b* acts to convert light emitted from the LED chips into other wavelengths of light. The phosphor layer 325*b* can then be covered by an additional silicone layer 325*c*. Naturally, additional layers could be used to provide filtering and/or to provide different properties and the depicted embodiment is fairly straightforward. One advantage of the depicted design is that the wall 318 of the recessed region 319 helps contain layers that are liquid and prevent those layers from dissipating or running into adjacent areas. Thus, the recess region 319 and the wall 318 together provide containment for the layers during manufacturing of the LED module without requiring additional fixtures or secondary walls.

As noted above, when providing LED chips a number of layers can be provided. This is generally applicable to any of the LED chip designs disclosed herein. It is common to use a silicone layer to protect the components and thus it is expected that a protective layer will include at least something similar to a silicone layer. Additional layers and/or filters (not shown) can be added above the LED chips depending on the application. For example, filters to block certain wave lengths and/or adjust the color of the light could be added. Of course, for an embodiment where the LED chips were configured in a RGB configuration the phosphor layer and the second silicone layer could be removed as the LED chips would provide the desired output without the need to use phosphor or filters to covert or block certain wavelengths of light. Thus, regardless of the configuration, the use of a recessed region provides a number of benefits and can be configured with the appropriate depth so as to contain the desired layers and the depicted three layers could be some other number of layers. It should he noted that if desired the light emitting region can he highly polished to improve light extraction and the light emitting region can also be shaped (in addition to or separate from any shaping of other portions of the base) so as to help control the shape of light emitted from the light emitting region.

As can be appreciated, the depicted LED modules can provide electrical connectivity in a compact and cost effective manner. It should be noted that in an embodiment the base of the LED module can be configured so that it is large enough such that no additional heat sinks are required. In an alternative configuration, the base can be configured to thermally couple to a heat sink and thus act more as a heat spreader.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

We claim:

1. A light emitting diode (LED) module, comprising:
a base, the base being thermally and electrically conductive and having a light emitting region and a connecting flange;
an insulative layer selectively provided on the base, the insulative layer configured to be positioned on the connecting flange;
a first trace and a second trace provided on the insulative layer, the first and second traces extending from pads on the connecting flange to a corresponding connecting region adjacent the light emitting region; and
LED chips mounted in the light emitting region in a pattern, the set of LED chips being electrically connected to the first and second traces such that the first and second traces provide an anode and a cathode for the LED chips.

2. The LED module of claim 1, wherein the connecting flange is offset from the light emitting region.

3. The LED module of claim 1, wherein the connecting flange is angled with respect to the base.

4. The LED module of claim 1, wherein the light emitting region is recessed in the base.

5. The LED module of claim 4, wherein the LED chips are covered by at east two layers.

6. The LED module of claim 5, wherein the base has a top surface and a bottom surface and the recess extends between the top and bottom surfaces and the at least two layers are below the top surface.

7. The LED module of claim 1, wherein the base is curved and the light emitting region is positioned in the base such that the base is configured to shape emitted light in a focused manner.

8. The LED module of claim 7, wherein the base includes an aperture that extends from a first side of the base to a second side opposite the first side, the first side supporting the LED chips, wherein the connecting flange extends from the aperture and is positioned on the second side.

9. A method of forming a light emitting diode (LED) module, comprising:
providing a base, the base having a reflective area and a connecting flange;
providing an insulative layer on the base, wherein the reflective area is substantially free of the insulative layer and the insulative layer at least partially covers the connecting flange;
providing a first trace and a second trace on the insulative layer, the first and second traces extending from adjacent the reflective area to the connecting flange;
positioning a plurality of LED chips on the reflective area;
electrically connecting the plurality of LED chips to the first and second traces; and
providing a protective coating over the LED chips.

10. The method of claim 9, wherein the reflective area is recessed.

11. The method of claim 10, wherein the providing of the first and second traces includes providing two pads on the connecting flange, one of the two pads electrically connected to the first trace and the other of the two pads electrically connected to the second trace.

12. The method of claim 11, wherein the forming of the traces comprises placing a conductive ink directly on the insulative layer.

13. The method of claim 11, wherein the forming of the traces comprises forming a pattern on the insulative layer with a laser and then placing the base in a plating bath so that a conductive layer forms on the pattern.

* * * * *